United States Patent [19]

Nopper

[11] Patent Number: 5,302,904
[45] Date of Patent: Apr. 12, 1994

[54] METHOD OF DETECTING INSULATION FAULTS AND SPARK TESTER FOR IMPLEMENTING THE METHOD

[75] Inventor: Peter Nopper, Lyss, Switzerland

[73] Assignee: Zumbach Electronic AG, Orpund, Switzerland

[21] Appl. No.: 953,717

[22] Filed: Sep. 30, 1992

[30] Foreign Application Priority Data

Oct. 29, 1991 [CH] Switzerland ............... 03154/91

[51] Int. Cl.$^5$ .................. G01R 31/08; G01R 31/12
[52] U.S. Cl. .................. 324/536; 324/515; 324/551
[58] Field of Search ............... 324/536, 551, 522, 541, 324/544, 521, 515, 517; 340/647, 660

[56] References Cited

U.S. PATENT DOCUMENTS

| | | | |
|---|---|---|---|
| 2,832,042 | 4/1958 | Lambert | 324/544 |
| 3,588,611 | 6/1971 | Lambden | 324/536 |
| 3,781,667 | 12/1973 | Tuttle | 324/544 |
| 4,387,336 | 6/1983 | Joy et al. | 324/536 |
| 4,446,420 | 5/1984 | Drouet | 324/536 |
| 5,194,817 | 3/1993 | Ward | 324/544 |

FOREIGN PATENT DOCUMENTS

| | | | |
|---|---|---|---|
| 0153740 | 1/1982 | Fed. Rep. of Germany | 324/551 |
| 0157673 | 6/1990 | Japan | 324/551 |

Primary Examiner—Kenneth A. Wieder
Assistant Examiner—Maura K. Regan
Attorney, Agent, or Firm—Spencer, Frank & Schneider

[57] ABSTRACT

A testing voltage of 800 to 5000 volts is applied to a measuring electrode constructed of carbon fiber brushes. This testing voltage is regulated to the desired value by means of a control circuit. Sparkover pulses travel through a filter to an output, with the response level of the testing voltage being regulated accordingly. Thus the test is reliable without highly electrically or mechanically stressing the test object.

18 Claims, 3 Drawing Sheets

METHOD OF DETECTING INSULATION FAULTS AND SPARK TESTER FOR IMPLEMENTING THE METHOD

BACKGROUND OF THE INVENTION

In order to detect insulation faults in continuous wires or cables, so-called spark testers are employed in which electrodes that are at a relatively high voltage lie loosely against the passing wire or cable while the conductor or conductors of the wire or cable are grounded. Generally loose chains or small wire brushes are employed as electrodes. Both types of electrodes are not fully satisfactory. In the case of chains there results an irregular and unreliable distribution of the voltage state, that is, the corona, at the surface of the insulation. In the case of metal brushes, abrasion produces very pointed and sharp-edged metal pieces that hook themselves into the insulation surface and thus may lead to short circuits. This is particularly the case when testing foamed insulations.

Prior art spark testers often have only one relay which, if there are insulation faults and sparkovers caused thereby between the electrodes and the conductor in the wire or cable, responds to the increased current and actuates a counter. This arrangement also has been found to be disadvantageous because, in order to obtain sufficient sensitivity, it has to operate with relatively high testing voltages. This necessity exists also because, under certain circumstances, considerable fluctuations may occur in the voltage. If tests are made with an alternating voltage, variable capacitances between the testing electrodes and the conductor of the object to be tested may produce considerable voltage fluctuations; be it that the voltage drops too much; be it that resonance causes undesirable excess voltages to occur. In the case of testing with direct voltage, charge transport at the surface of the insulation may produce a variable load and thus undesirable changes in voltage.

SUMMARY OF THE INVENTION

It is the object of the present invention to provide a method and a spark tester in which the above-mentioned drawbacks are avoided. This object is initially accomplished by a method of detecting insulation faults, including applying a voltage across the insulation by electrodes that contact the surface of the insulation, and detecting and counting pulses caused by sparkovers of the applied voltage due to defects in the insulation; and wherein a relatively low voltage of, for example, 800 to 5000 V is applied by means of carbon fiber brush electrodes. It has been shown that brushes of carbon fibers may have a very large number of extremely fine and pliant fibers of a diameter of, for example, 0.007 mm, so that a very uniform coverage of the insulation surface is possible with a certain number of such brushes. The very large number of extremely fine fibers results in the formation of a very uniform corona and a very uniform voltage distribution over the surface of the insulation which, in turn, makes it possible to operate with a relatively lower voltage.

Preferably, the testing voltage is regulated to a certain desired value. A certain combination effect is then realized insofar as, thanks to the use of carbon fiber brushes as electrodes, uniform, constant conditions can be created at the measuring location which, in turn, facilitate voltage regulation and, on the other hand, the voltage regulation makes it possible to maintain constant conditions at the measuring location.

If an alternating voltage is applied, the frequency can preferably also be regulated. The advantages that are then realizable under certain conditions will be described in greater detail below.

Another measure for increasing the reliability of the measurement in spite of the use of relatively low testing voltages may reside in that noise signals are eliminated from the measuring signals by means of filters. Thus it is possible to further increase the reliability of the measurement.

Preferably, the pulses occurring at sparkovers may be detected with a response level that is a function of the measuring voltage. The measuring voltage is selected at different levels depending on the object being measured, particularly the thickness of the insulation, and it is therefore indicated to select a higher response level at a higher measuring voltage so that noise signals will not initiate a response and thus falsify the measuring result.

BRIEF DESCRIPTION OF THE DRAWINGS

The invention will be described below in greater detail with reference to the drawing figures.

DETAILED DESCRIPTION OF THE PREFERRED EMBODIMENTS

Figure 1:
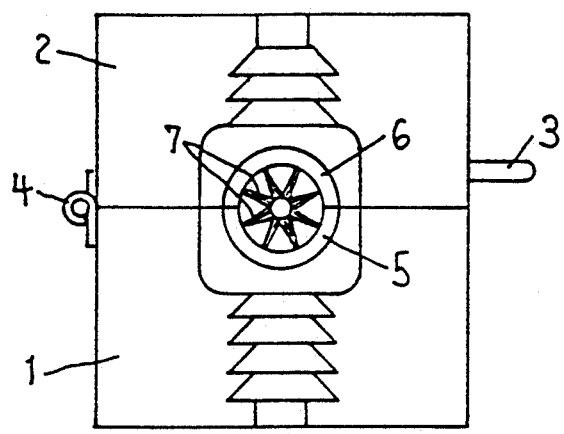
FIG. 1 is a schematic representation of an example of an electrode arrangement at a spark tester according to the invention.

FIG. 1 depicts two housing components 1 and 2. By means of a handle 3, the upper housing component 2 may be raised and pivoted upward about a hinge 4. Semicircular electrode carriers 5 and 6 are fastened to the two housing components 1 and 2, to which radially inwardly oriented carbon fiber brushes 7 are fastened.

In the illustrated closed state of housing components 1 and 2, the fine inner ends of the carbon fibers of the individual brushes 7 practically form a uniform, contiguous felt of fibers which lie uniformly against the exterior surface of the insulation of a measuring object, for example a wire or a cable, not shown in FIG. 1, which passes through the housing along the common axis of ring halves 5 and 6. A voltage can be applied to electrode carriers 5 and 6 and thus to electrodes 7 by way of non-illustrated insulated leads, and sparkovers between the electrodes 7 and the conductor of the measuring object passing through are detected and counted in a manner to be described below. For the introduction of a new measuring object or for maintenance work, housing components 1 and 2 can be opened as mentioned.

Figure 2:
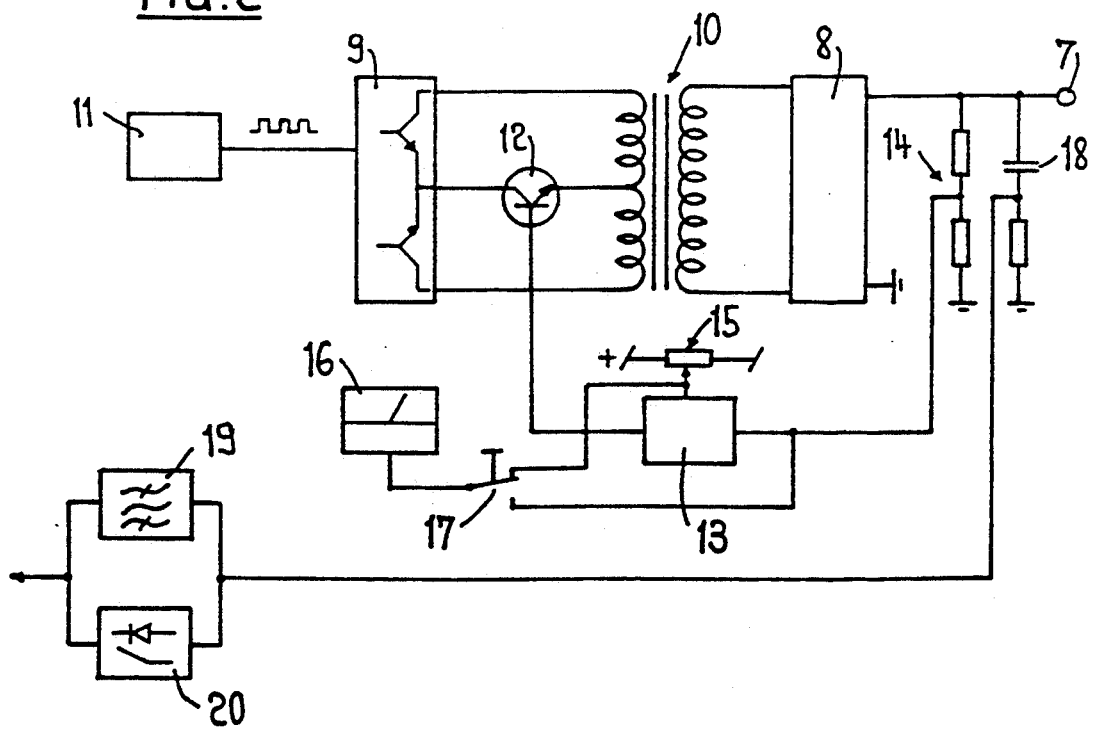
FIG. 2 depicts the circuit of a spark tester according to the invention operating with direct voltage.

FIG. 2 shows the circuit of a spark tester operating with direct voltage. The electrode is shown schematically and marked 7. It receives the testing voltage of, for example 800 to 5000 volts from a direct voltage generator 8. This high voltage generator 8 is also provided with a power amplifier 9 equipped with a high voltage transformer 10. The power amplifier is actuated by an oscillator 11. Between power amplifier 9 and transformer 10, there is disposed a control element 12 that is connected with the output of a voltage regulator 13. The input of this voltage regulator 13 is connected with a voltage divider 14 that is connected with the measuring electrode 7. Voltage regulator 13 additionally includes a desired value input which is connected with a desired value generator 15. A display 16 may be connected by means of a switch 17 with the desired value at generator 15 or with the actual value at voltage divider 14. Measuring electrode 7 is connected by way of a capacitor 18 with a bandpass filter 19 and a response level regulator 20. If there is a sparkover between measuring electrode 7 and the conductor of a measuring object, measuring pulses appear at the output of circuit 19, 20 which will be described in greater detail below. These output pulses are counted and an alarm may be given.

The mode of operation of the circuit according to FIG. 2 is substantially evident from the schematic representation. Corresponding to the position of desired value generator 15, the voltage is automatically regulated to this desired value, which may be displayed for monitoring purposes. Thus it is also possible to set increasing voltages for different types of measuring objects at desired value generator 15 and to monitor them on a display 16, whereupon the system is automatically regulated to the selected voltage. By switching switch 17, it can be tested in each case whether the set voltage actually appears at measuring electrode 7. The operation of circuit components 19 and 20 will be described below.

Figure 3:
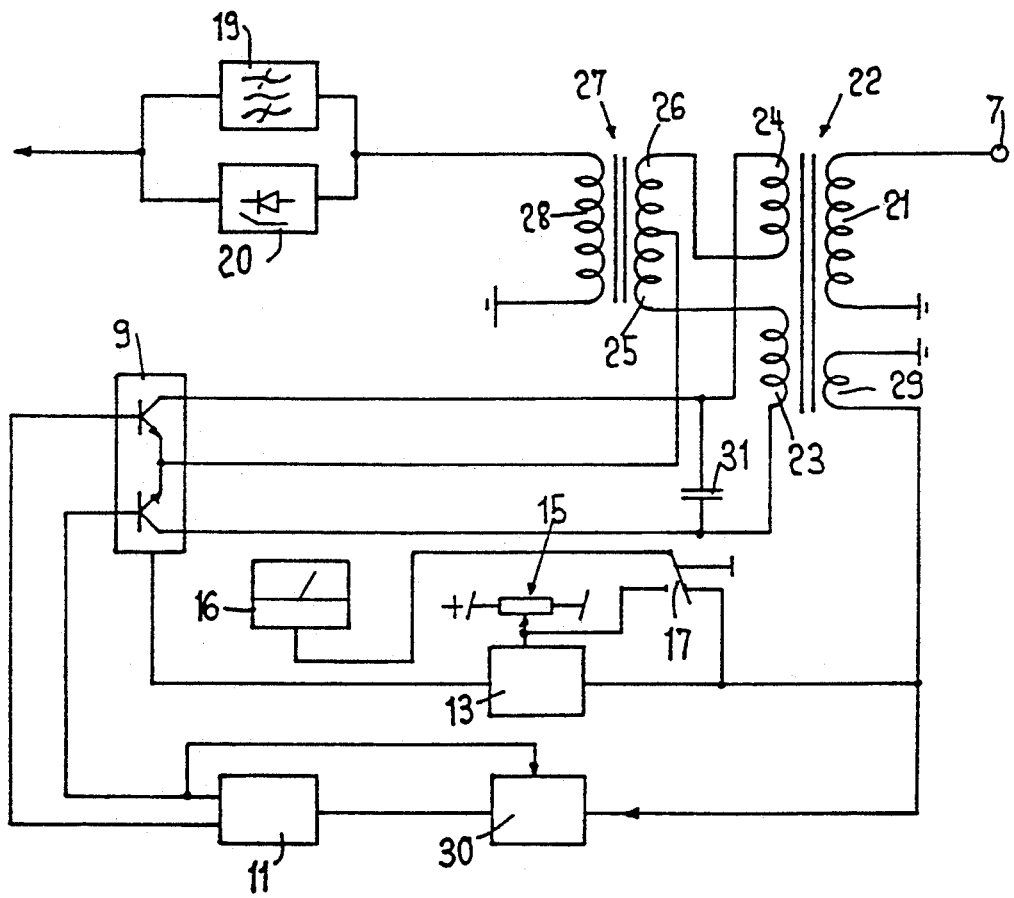
FIG. 3 is a circuit diagram for a spark tester according to the invention operating with alternating voltage.

In FIG. 3 corresponding switching elements bear the same reference numerals as in FIG. 2. Measuring electrode 7 is connected directly with the high voltage winding 21 of a high voltage transformer 22. The primary windings 23 and 24 of transformer 22 are connected in series with the primary windings 25 and 26 of a measuring transformer 27 whose secondary winding 28 is connected with circuits 19 and 20. High voltage transformer 22 includes a measuring winding 29 which is connected with voltage regulator 13 and with a phase detector 30. Voltage regulator 13 acts on the controlled power amplifier 9. Phase detector 30 compares the phase of the primary circuit of the high voltage transformer 22, after the current has been supplemented into a resonant circuit by means of a capacitor 31, with the phase of oscillator 11 and adjusts its frequency for resonance as a function of the phase position. The reactive effect of the measuring object impedance on the primary winding causes a phase shift in this circuit between the oscillator frequency and the resonant circuit frequency. The frequency is controlled in such a manner that the resonance condition in the resonant circuit formed of the primary winding of high voltage transformer 22 and a tuning capacitor 31 is met constantly. The resonance principle allows the realization of the required high voltage in a certain load range with a minimum power requirement and minimum power loss.

Figure 4:
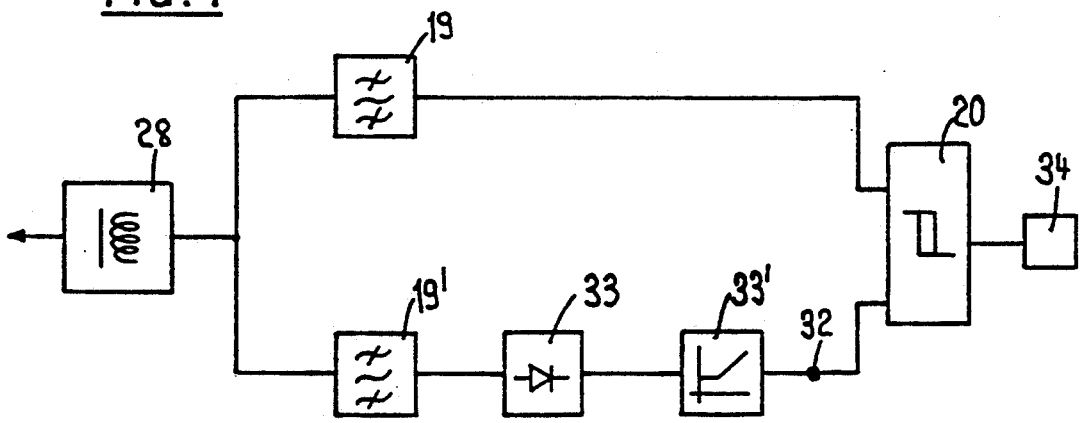
FIG. 4 gives a circuit example of filters combined with a regulation of the response level.

FIG. 4 shows an embodiment of circuits 19 and 20 in an alternating voltage embodiment according to FIG. 3. A practically constant alternating voltage appears at the input of this circuit in normal operation from the secondary winding 28 at a frequency of 50 to 3000 Hz. Bandpass filter 19 suppresses signals below 50 Hz and above 1 MHz. Thus capacitive changes in current in the low frequency range and the white noise in the high frequency range due to corona effects are suppressed. Only the relevant signals in the above-mentioned transmission range, that is, from the sparkover pulses, are permitted to pass. A positive voltage is built up at point 32 in the lower branch of the circuit by way of a bandpass filter 19' that has a pass band corresponding to the range of the operating frequency and by a diode 33, with this positive voltage being approximately proportional to the voltage of the input signal, that is the testing voltage across electrode 7. The curve of the control voltage is shown in FIG. 4. Therefore, a comparison circuit 20 transmits only those pulses to a counter 34 whose level lies above the bias across point 32. Thus the response level is regulated and increases with increasing testing voltage corresponding to the function of a control member 33'.

Figure 5:
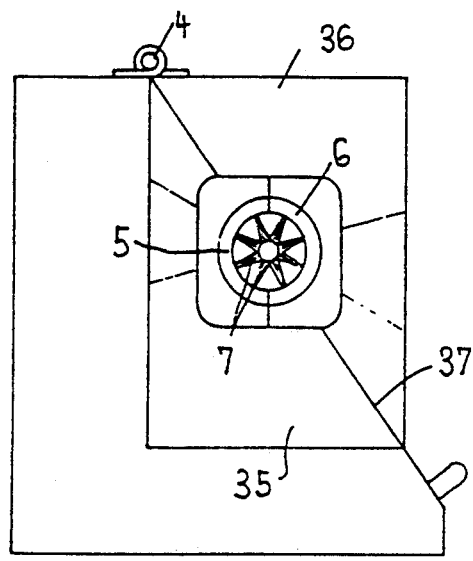
FIG. 5 is a schematic representation of a further embodiment of the electrode arrangement according to the invention.

FIG. 5 is a schematic representation of a similar arrangement a FIG. 1 with the difference that housing components 35 and 36 are pivotal about an inclined plane 37. The remaining components bear the same reference numerals as in FIG. 1. Of significance is here that the groove between electrode carriers 5 and 6 is vertical in such a way that a liquid possibly introduced from the passing cable or wire, for example, cooling water, is able to flow off through the lower groove.

Figure 6:
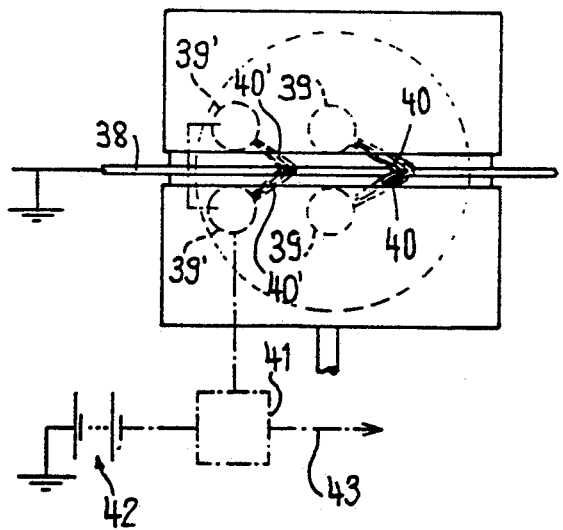
FIGS. 6 and 7 show an electrode arrangement for flat test objects and another variation of the invention.
Figure 7:
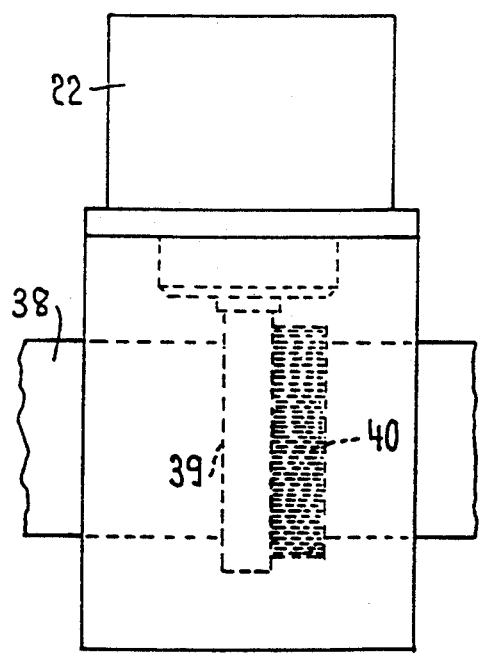

FIGS. 6 and 7 are schematic representations of an embodiment for a flat cable 38. Elongate carbon fiber brushes 40 are attached to the rod-shaped electrode carriers 39, with their fibers lying uniformly against the flat and narrow sides of cable 38. As indicated in FIG. 7, the housing accommodating the testing electrodes is constructed directly together with the high voltage transformer 22.

The filter 19 according to FIG. 2 and the circuit 20 for controlling the response level have a similar configuration and operate corresponding to the circuit of FIG. 4. If the voltage across electrode 7 breaks down in the case of a sparkover, a pulse is transmitted by way of capacitor 18, with the negative front edge of the pulse being detected by appropriate switching of diode 33 and a correspondingly negative bias across point 32. Or, the positive trailing edge of the pulse could be detected by the circuit of FIG. 4. The noise transmitted through capacitor 18, which increases with increasing testing voltage, is rectified and serves as a bias for regulating the response threshold in the sense of FIG. 4, with this bias, as already mentioned, being positive or negative.

In many cases it is desirable to distinguish between insulation faults in which a sparkover occurs from the electrode to the conductor and larger bare spots in which a short-circuit occurs between the electrode and the conductor. In addition to the above-described system components which operate with a test voltage of more than 800 V and with corona formation for determining sparkovers as the result of insulation faults, a further measuring location may be provided for this purpose, with which larger bare spots are determined by means of voltages lower than 800 V and without corona formation. Such an arrangement is shown in dash-dot lines in FIG. 6 but not in FIG. 7. Accordingly, a second pair of electrode carriers 39' equipped with carbon fiber brushes 40' is provided as electrodes which are connected with a relay 41. By way of relay 41 these electrodes are connected with a voltage source 42. If a bare spot enters the region of electrodes 40', a direct conductive connection is established at this location and a current flows through relay 41 which puts out a signal by way of a line 43, for example, to a counter that counts and displays the number of bare spots. In this application as well, the carbon fiber brushes have the advantage that they cover the surface of the object to be tested practically without interruption and thus reliably detect even a small bare spot. The brush configuration and arrangement must here be adapted to the object, for example, as shown in FIG. 1.

It will be understood that the above description of the present invention is susceptible to various modifications, changes and adaptations, and the same are intended to be comprehended within the meaning and range of equivalents of the appended claims.

What is claimed is:

1. In a method of detecting insulation faults in a test object, including applying a voltage to a layer of insulation of the object by means of electrodes that contact the surface of the insulation; and detecting and counting pulses caused by sparkovers of the applied voltage due to defects in the insulation; the improvement wherein said step of applying comprises applying a relatively low voltage of 800 to 5000 V by means of carbon fiber brush electrodes.

2. A method according to claim 1, regulating the applied voltage.

3. A method according to claim 1, wherein the applied voltage is an alternating voltage and further comprising providing the applied voltage via a high voltage transformer which is a component of a resonant circuit so that the power loss can be reduced to a minimum.

4. A method according to claim 3, further comprising providing a continuous control of the resonance condition by measuring the phase shift between the supply oscillator frequency and the resonant circuit frequency caused by the reactive effect of the impedance of the test object on the primary side of the high voltage transformer and adjusting the frequency of the oscillator.

5. A method according to claim 1, further comprising eliminating noise signals by means of filters from the measuring signal including the pulses.

6. A method according to claim 1, wherein said step of detecting includes detecting the pulses with a response level that is a function of the applied voltage.

7. A method according to claim 1 wherein: the object is an electrical cable having an outer layer of insulation to be tested; and the carbon fiber brush electrodes contact the outer surface of the layer of insulation.

8. A method according to claim 7 wherein the voltage is applied around the cable at a first location along a path of travel of the cable.

9. A method according to claim 8, further comprising applying a lower voltage below 800 V to the cable at another location along the path of travel by means of further carbon fiber brushes in order to detect bare spots in the insulation layer.

10. A spark tester for testing insulation to detect insulation faults in an insulated electrical cable disposed along a given path comprising:
testing electrodes disposed at a first position along the path for surrounding and contacting the outer surface of the insulation of the cable with said testing electrodes comprising carbon fiber brushes; a testing voltage generator means for generating, and applying to said electrodes, voltages that are sufficient to form a corona at the carbon fiber ends; and circuit means for detecting pulses caused by sparkovers of the voltage applied to said electrodes due to defects in the insulation.

11. A tester according to claim 10, wherein said carbon fiber brushes are attached to dividable electrode carriers that are connected with one another in a pivotal manner.

12. A tester according to claim 10, further comprising a voltage regulator for regulating the testing voltage.

13. A tester according to claim 10, wherein said circuit means includes a bandpass filter for the measuring signal.

14. A tester according to claim 10, wherein said circuit means for detecting includes a sparkover pulse detector having a response level that is regulated as a function of the applied testing voltage.

15. A tester according to claim 10 further comprising additional testing electrodes including further of said carbon fiber brushes disposed at a further position along said path for contacting the outer surface of the insulation; said additional testing electrode being connected by way of an evaluation circuit with a testing voltage source of a voltage that is insufficient to form a corona at the carbon fiber ends of the additional testing electrodes.

16. A spark tester according to claim 10 wherein said voltage of said testing voltage generator is from 800–5000 V.

17. A spark tester according to claim 10 wherein said voltage applied to said electrodes is a d.c. voltage and wherein said circuit means for detecting includes means connected to said electrodes for detecting current pulses produced by sparkovers.

18. A tester according to claim 10 wherein: said voltage applied to said electrodes is an alternating voltage produced by an oscillator and applied to said electrodes via a high voltage transformer whose secondary winding is connected to said electrodes and whose primary winding receives an output signal from said oscillator and is part of a resonant circuit; and circuit means for regulating the frequency of said oscillator to maintain said resonant circuit in resonance in order to minimize power loses.

* * * * *